United States Patent [19]
Kimura et al.

[11] Patent Number: 5,825,053
[45] Date of Patent: Oct. 20, 1998

[54] HETEROSTRUCTURE III-V NITRIDE SEMICONDUCTOR DEVICE INCLUDING INP SUBSTRATE

[75] Inventors: Akitaka Kimura; Haruo Sunakawa; Masaaki Nido; Atsushi Yamaguchi, all of Tokyo, Japan

[73] Assignee: NEC Corporation, Tokyo, Japan

[21] Appl. No.: 799,828

[22] Filed: Feb. 13, 1997

[30] Foreign Application Priority Data

Feb. 14, 1996 [JP] Japan .................................... 8-049632

[51] Int. Cl.$^6$ ..................................................... H01L 33/00
[52] U.S. Cl. .......................... 257/94; 257/103; 257/615; 257/628
[58] Field of Search .............................. 257/94, 103, 615, 257/627, 628

[56] References Cited

U.S. PATENT DOCUMENTS 5,652,762  7/1997  Otsuka et al. ........................... 257/14

OTHER PUBLICATIONS

Nakamura, "InGaN/AlGaN blue–light–emitting diodes", J. Vac. Sci. Technol. A 13(3), PP. 705–710, May/Jun. 1995.

*Primary Examiner*—Minh-Loan Tran
*Attorney, Agent, or Firm*—Foley & Lardner

[57] ABSTRACT

In a heterostructure III–V nitride semiconductor device, an InP substrate has a surface having a sloped angle of 0° to 16° with respect to a (100) surface thereof. At least one GaN layer is formed on the InP substrate.

3 Claims, 6 Drawing Sheets

HETEROSTRUCTURE III-V NITRIDE SEMICONDUCTOR DEVICE INCLUDING INP SUBSTRATE

BACKGROUND OF THE INVENTION

1. Field of the Invention

The present invention relates to a heterostructure III–V nitride semiconductor device capable of avoiding the generation of cracks therein.

2. Description of the Related Art

III–V nitride semiconductor devices have been adapted to light-emitting diodes (LEDs) and laser diodes (LDs) emitting blue and ultraviolet light due to their relatively large energy gap.

In prior art heterostructure III–V nitride semiconductor devices, at least one GaN layer is formed on a sapphire substrate or a GaAs substrate. In this case, the GaN layer is grown at a relatively high temperature (see: Shuji Nakamura, "InGaN/AlGaN blue-light-emitting diodes", J. Vac. Scl. Technol. A 13(3), pp. 705–710, May/June (1995). This will be explained later in detail.

In the above-described prior art heterostructure nitride semiconductor devices, however, since there is a large difference in thermal expansibility between the substrate and the GaN layer, cracks may be generated in the substrate and/or the GaN layer when the device is cooled from the high temperature to room temperature.

SUMMARY OF THE INVENTION

It is an object of the present invention to suppress the generation of cracks in a heterostructure III–V nitride semiconductor device.

Another object is to provide a method for such a heterostructure III–V nitride semiconductor device.

According to the present invention, in a heterostructure III–V nitride semiconductor device, an InP substrate has a surface having a sloped angle of 0° to 16° with respect to a (100) surface thereof. At least one GaN layer is formed on the InP substrate.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENTS

Before the description of the preferred embodiments, a prior art III–V nitride semiconductor device will be explained with reference to FIG. 1.

Figure 1:
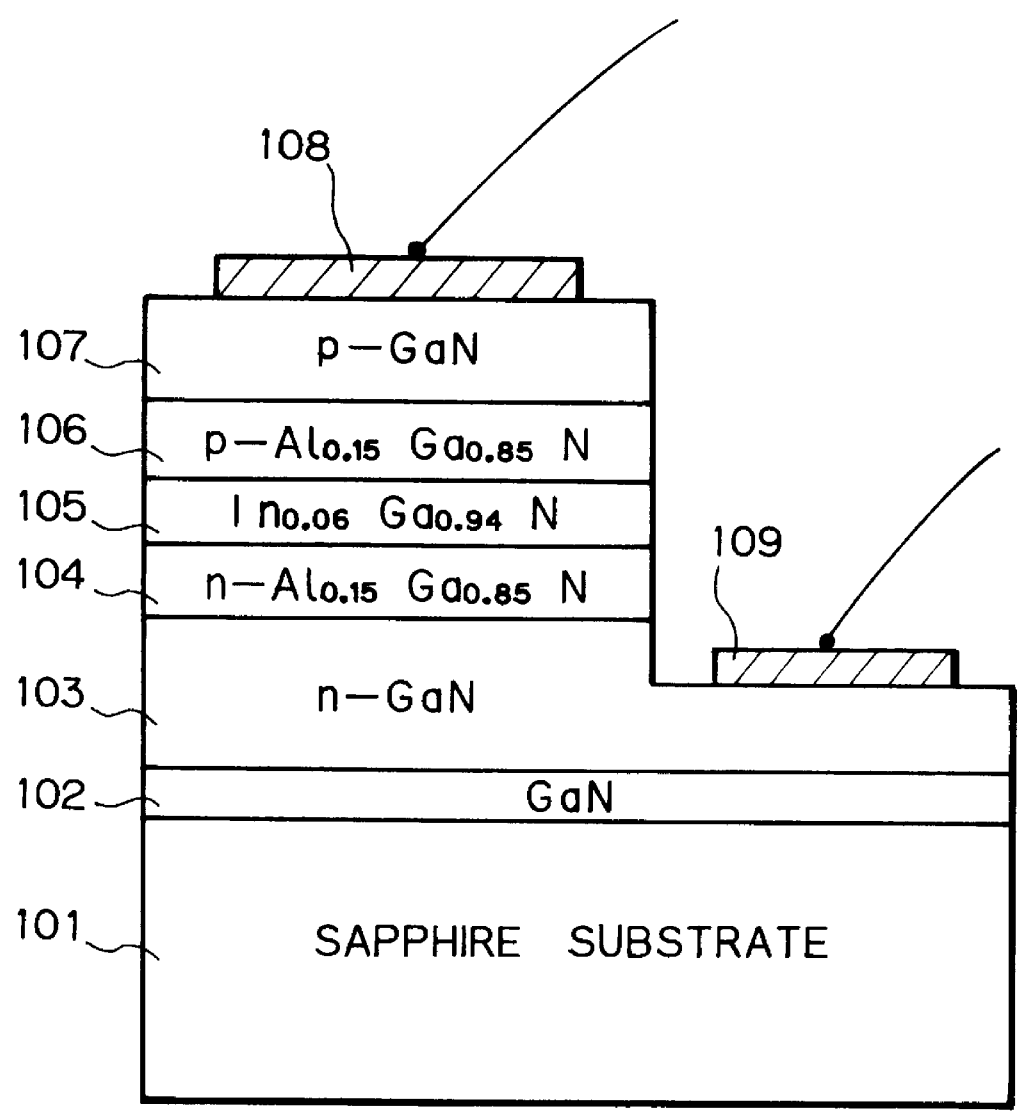
FIG. 1 is a cross-sectional view illustrating a first prior art heterostructure III–V nitride semiconductor device.

In FIG. 1, which illustrates a first prior art III–V nitride semiconductor device (see: shuji Nakamura, "InGaN/AlGaN blue-light-emitting diodes", J. Vac. Scl. Technol. A 13(3), pp. 705–710, May/June 1995), an LED is illustrated. That is, a sapphire substrate 101 having a (0001) surface is used. The sapphire substrate 101 is put in a metalorganic chemical deposition (MOCVD) apparatus, and is heated to 1050° C. Then, the substrate temperature is lowered to 510° C., to form a 300 nm thick GaN buffer layer 102 on the substrate 101. Then, the substrate temperature is raised to 1020° C., to form a 4 $\mu$m thick Si-doped n-type GaN layer 103 on the GaN buffer layer 102, and thereafter, to form a 0.15 $\mu$m thick Si-doped n-type $Al_{0.15}Ga_{0.85}N$ layer 104 is formed on the n-type GaN layer 103. Then, the substrate temperature is lowered to 800° C., to form a 100 nm thick Zn- and Si-doped $In_{0.06}Ga_{0.94}N$ layer 105 on the n-type $Al_{0.15}Ga_{0.85}N$ layer 104. Again, the substrate temperature is raised to 1020° C., to form a 0.15 $\mu$m thick Mg-doped p-type $Al_{0.15}Ga_{0.85}N$ layer 106 on the $In_{0.06}Ga_{0.84}N$ layer 105, and thereafter, a 0.5 $\mu$m thick Mg-doped p-type GaN layer 107 is formed on the p-type $Al_{0.15}Ga_{0.85}N$ layer 106. The p-type GaN layer 107 is used as a good ohmic contact for a p-type Ni/Au electrode 108, and the n-type GaN layer 103 is used as a good ohmic contact for an n-type Ti/Al electrode 109.

In the device of FIG. 1, the thermal expansibility $\Delta a/a$ of the sapphire substrate 101 is $7.5 \times 10^{-6} K^{-1}$, while the thermal expansibility $\Delta a/a$ of the GaN layers 102, 103 and 107 thereon having a wurtzite structure is $5.59 \times 10^{-6} K^{-1}$. That is, there is a large difference in thermal expansibility between the sapphier substrate 101 and the wurtzite structure. As a result, when the substrate temperature is lowered from a high temperature such as 1020° C. to room temperature, cracks may be generated in the sapphire substrate 101 and/or the GaN layers 102, 103 and 107.

Figure 2:
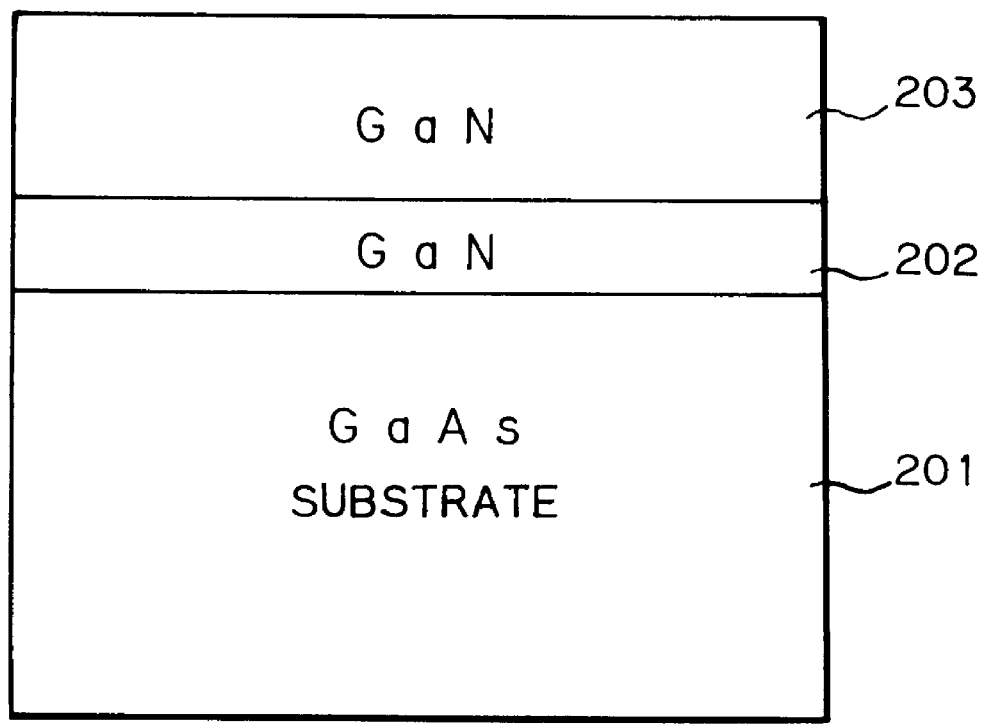
FIG. 2 is a cross-sectional view illustrating a second prior art heterostructure III–V nitride semiconductor device.

In FIG. 2, which illustrates a second prior art III–V nitride semiconductor device, a 450 $\mu$m thick CrO-doped GaAs substrate 201 having a (100) surface is used. In this case, the concentration of CrO in the GaAs substrate 201 is 0.33 weight ppm. The GaAs substrate 201 is put in a hydride CVD apparatus. Then, the substrate temperature is raised to 630° C. to 640° for five minutes, to remove oxide from the GaAs substrate 201. Then, the substrate temperature is lowered to 485° C. for thirty minutes, to form a GaN layer 202 on the GaAs substrate 201. Then, the substrate temperature is raised to 700° C. for thirty minutes, to form a GaN layer 203 on the GaN layer 202. Note that the GaN layers 202 and 203 are both undoped.

Also, in the device of FIG, 2, the thermal expansibility $\Delta a/a$ of the GaAs substrate 201 is $6.86 \times 10^{-6} K^{-1}$, while the thermal expansibility $\Delta a/a$ of the GaN layers 202 and 203 thereon having a wurtzite structure is $4.50 \times 10^{-6} K^{-1}$. That is, there is a large difference in thermal expansibility between the GaAs substrate 201 and the wurtzite structure. As a result, when the substrate temperature is lowered from a high temperature such as 700° C. to room temperature, cracks may be generated in the GaAs substrate 201 and/or the GaN layers 202 and 203.

Figure 3A:
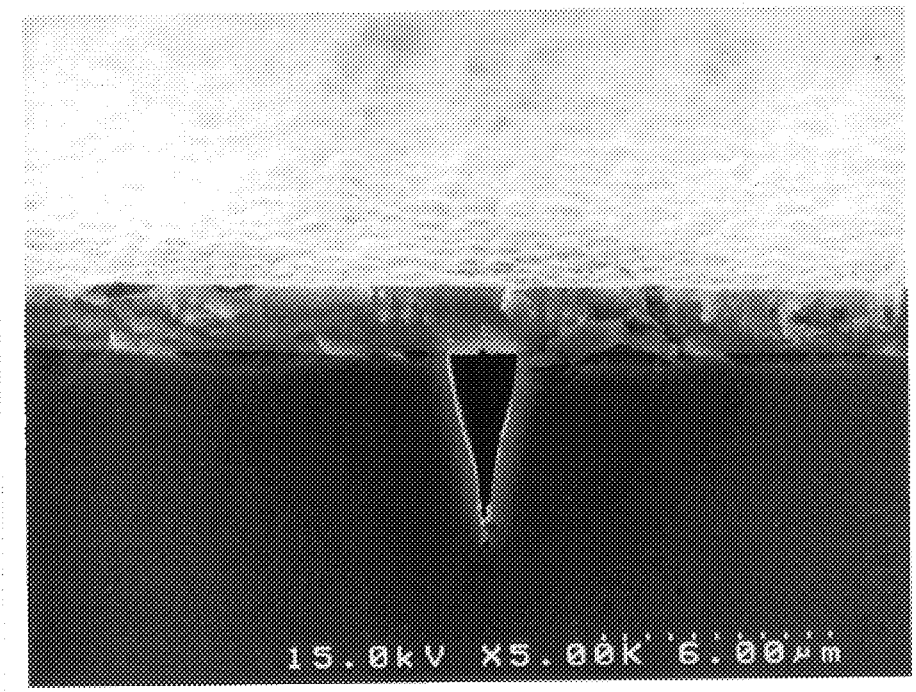
FIG. 3A is a photograph showing a cross section of the device of FIG. 2.
Figure 3B:
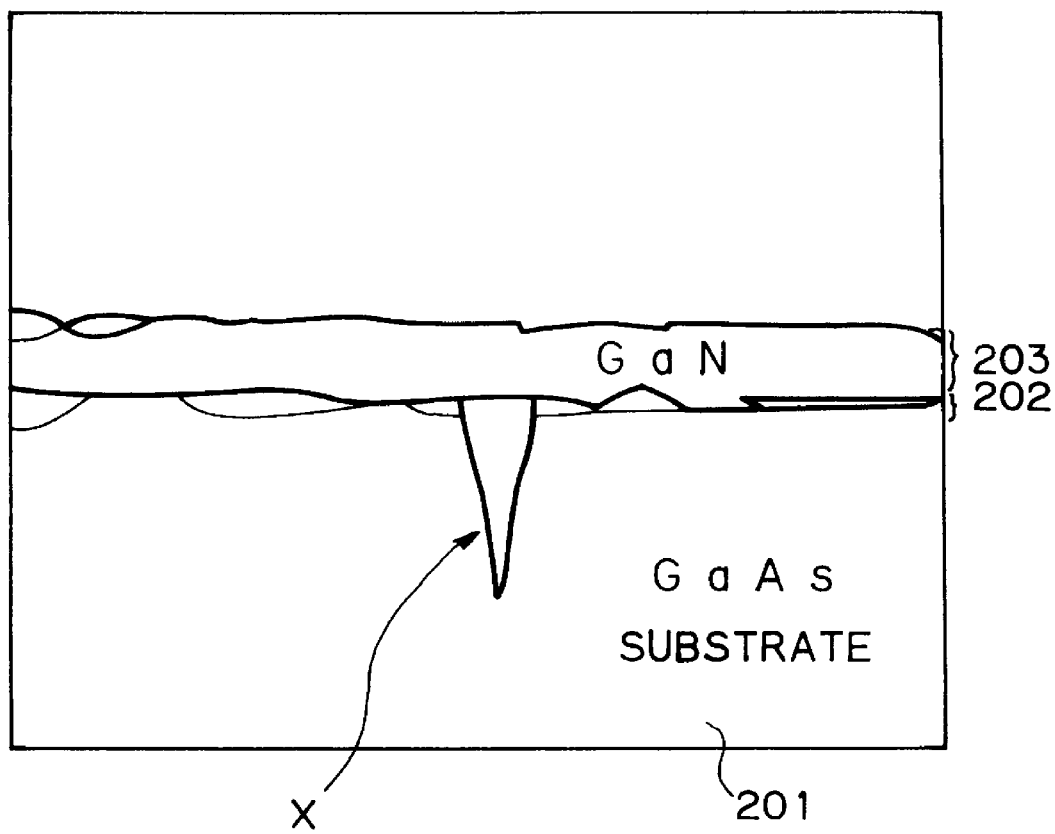
FIG. 3B is a cross-sectional view schematically illustrating the cross section of FIG; 3A.

Actually, according to the inventors' experiment, as shown in FIGS. 3A and 3B, a wedge-shaped crack as indicated by X was observed.

In a third prior art III–V nitride semiconductor device (not shown), a GaAs substrate having a (111) A surface or a (111) B surface is used. In this case, in the same way as in the second prior art III–V nitride semiconductor device, even if GaN layers are formed on the GaAs substrate, the thermal expansibility $\Delta a/a$ of the GaAs substrate is $6.86 \times 10^{-6} K^{-1}$, while the thermal expansibility Δa/a of the GaN layers 202 and 203 thereon having a wurtzite structure is $5.59 \times 10^{-6} \mathrm{K}^{-1}$. That is, there is also a large difference in thermal expansibility between the GaAs substrate and the wurtzite structure. As a result, when the substrate temperature is lowered from a high temperature to room temperature, cracks may be generated in the GaAs substrate and/or the GaN layers.

Figure 4:
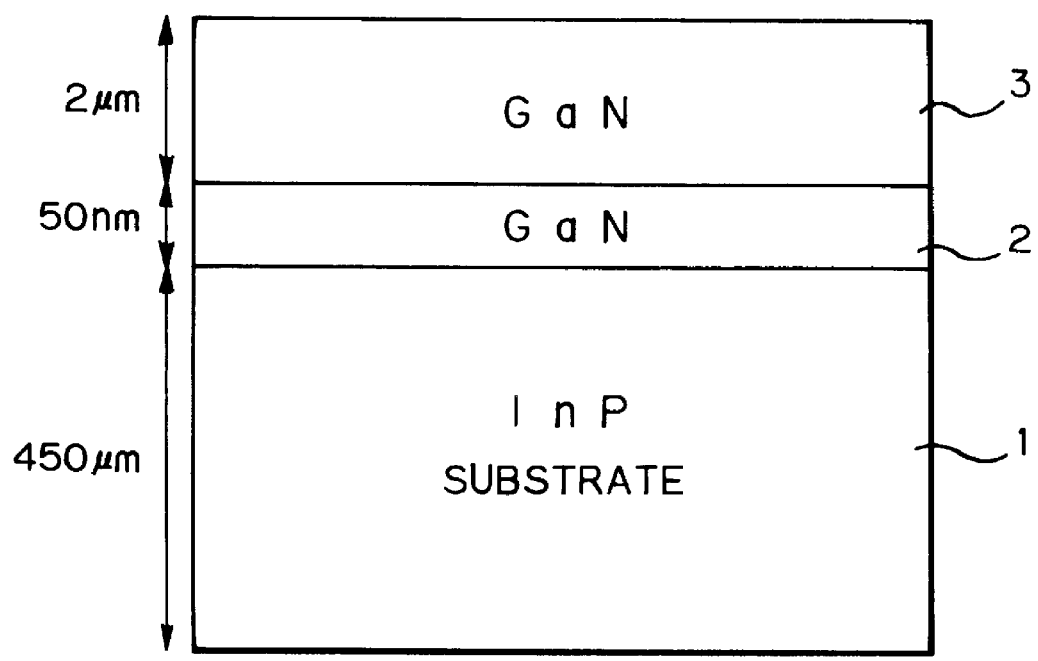
FIG. 4 is a cross-sectional view illustrating a first embodiment of the heterostructure III–V nitride semiconductor device according to the present invention.

In FIG. 4, which illustrates a first embodiment of III–V nitride semiconductor device according to the present invention, an about 450 μm thick Sn-doped InP substrate 1 having a surface at a sloped angle of 0° to 16° with respect to a (100) surface is used. In this case, the concentration of Sn in the InP substrate 1 is $2 \times 10^{18} \mathrm{cm}^{-3}$. The InP substrate 1 is put in a hydride CVD apparatus. Then, the substrate temperature is raised to 630° C. to 640° for five minutes, to remove oxide from the InP substrate 1. Then, the substrate temperature is lowered to 485° C. for thirty minutes, to form an about 50 nm thick GaN layer 2 on the InP substrate 1. Then, the substrate temperature is raised to 700° C. for thirty minutes, to form an about 2 μm thick GaN layer 3 on the Gan layer 2. Note that the GaN layers 2 and 3 are both undoped.

When the GaN layers 2 and 3 are formed on the InP substrate 1 having a sloped surface at an angle of 0° to 16° with respect to the (100) surface, the GaN layers 2 and 3 have a zinc-blende structure. Therefore, the thermal expansibility Δa/a of the InP substrate 1 is $4.75 \times 10^{-6} \mathrm{K}^{-1}$, while the thermal expansibility Δa/a of the GaN layers 2 and 3 thereon having a zinc-blende structure is $4.50 \times 10^{-6} \mathrm{K}^{-1}$. That is, there is a very small difference in thermal expansibility between the InP substrate 1 and the zinc-blende structure. As a result, even when the substrate temperature is lowered from a high temperature such as 700° C. to room temperature, cracks may be hardly generated in the InP substrate 1 and/or the GaN layers 2 and 3.

The first embodiment as illustrated in FIG. 4 can be applied to a III–V nitride semiconductor device having at least one GaN layer.

Figure 5:
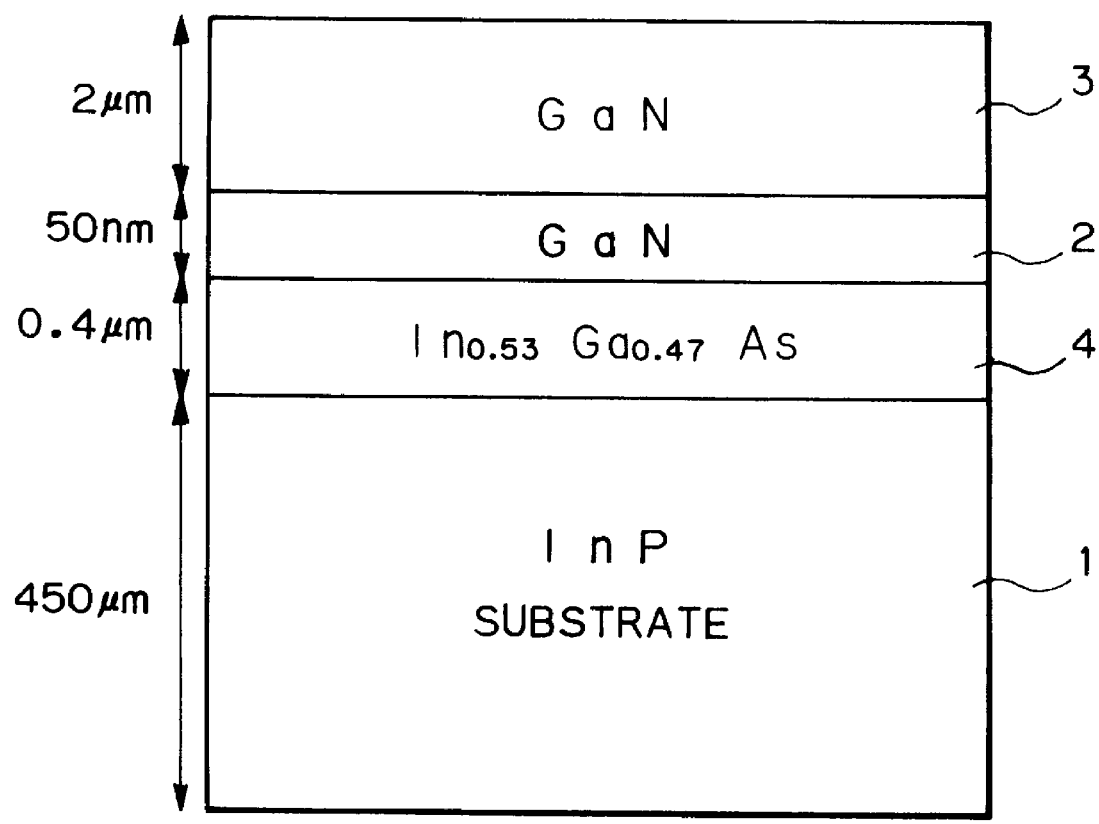
FIG. 5 is a cross-sectional view illustrating a second embodiment of the heterostructure III–V nitride semiconductor device according to the present invention.

In FIG. 5, which illustrates a second embodiment of the III–V nitride semiconductor device according to the present invention, an about 0.4 μm thick $In_{0.53}Ga_{0.47}As$ layer 4 is interposed between the InP substrate 1 and the GaN layer 2 of FIG. 4. The difference in lattice constant between the $In_{0.53}Ga_{0.47}As$ layer 4 and the InP substrate 1 is only ±2 percent, and therefore, the $In_{0.53}Ga_{0.47}As$ layer 4 lattice-matches the InP substrate 1. Thus, it is easy to form the $In_{0.53}Ga_{0.47}As$ layer 4 on the InP substrate 1. Also, the vapor pressure of each of In, Ga and As constituting the $In_{0.53}Ga_{0.47}As$ layer 4 is smaller than that of P or InP.

First, the InP substrate 1 is put in an MOCVD apparatus, to form the $In_{0.53}Ga_{0.47}As$ layer 4. Thereafter, in the same way as in the first embodiment, the InP substrate 1 associated with the $In_{0.53}Ga_{0.47}As$ layer 4 is put in a hydride CVD apparatus. Then, the substrate temperature is raised to 630° C. to 640° for five minutes, to remove oxide from the $In_{0.53}Ga_{0.47}As$ layer 4. Then, the substrate temperature is lowered to 485° C. for thirty minutes, to form an about 50 nm thick GaN layer 2 on the $In_{0.53}Ga_{0.47}As$ layer 4. Then, the substrate temperature is raised to 700° C. for thirty minutes, to form an about 2 μm thick GaN layer 3 on the Gan layer 2. Note that the $In_{0.53}Ga_{0.47}As$ layer 4 and the GaN layers 2 and 3 are all undoped.

Even in FIG. 5, since the GaN layers 2 and 3 are formed over the InP substrate 1 having a sloped surface at an angle of 0° to 16° with respect to the (100) surface, the GaN layers 2 and 3 have a zinc-blende structure. Therefore, the thermal expansibility Δa/a of the InP substrate 1 is $4.75 \times 10^{-6} \mathrm{K}^{-1}$, while the thermal expansibility Δa/a of the GaN layers 2 and 3 thereon having a zinc-blende structure is $4.50 \times 10^{-6} \mathrm{K}^{-1}$. That is, there is a very small difference in thermal expansibility between the InP substrate 1 and the zinc-blende structure. As a result, even when the substrate temperature is lowered from a high temperature such as 700° C. to room temperature, cracks may be hardly generated in the InP substrate 1 and/or the GaN layers 2 and 3.

Generally, phosphorus is out-diffused from the InP substrate 1 at a substrate temperature of higher than about 200° C. In FIG. 5, however, due to the presence of the $In_{0.53}Ga_{0.47}As$ layer 4 which does not include phosphorus, phosphorus is hardly out-diffused from the InP substrate 1 to the GaN layers 2 and 3 even at a substrate temperature of about 700° C. Thus, the quality of the GaN layers 2 and 3 can be improved as compared with those of FIG. 4.

Note that the thermal expansibility Δa/a of the $In_{0.53}Ga_{0.47}As$ layer 4 is $5.62 \times 10^{-6} \mathrm{K}^{-1}$, and is a relatively large difference from that of the InP substrate 1 and that of the GaN layers 2 and 3. In this case, however, since the $In_{0.53}Ga_{0.47}As$ layer 4 is much thinner than the InP substrate 1, such a difference may not generate cracks in the InP substrate 1 and/or the GaN layers 2 and 3.

Also, the second embodiment as illustrated in FIG. 4 can be applied to a III–V nitride semiconductor device having at least one GaN layer. Further, a crystalline layer, which does not include atoms having a larger vapor pressure than that of phosphorus and has a lattice constant within 0.98 to 1.02 times as large as that of the InP substrate 1, can be used instead of the $In_{0.53}Ga_{0.47}As$ layer 4.

As explained hereinabove, according to the present invention, since use is made of InP as a substrate, cracks can be hardly generated in the substrate and GaN layers thereon, even when the substrate temperature is lowered from a high temperature such as 700° C. to room temperature.

We claim:

1. A heterostructure III–V nitride semiconductor device comprising:

an InP substrate having a surface having a sloped angle of 0° to 16° with respect to a (100) face of said InP substrate; and at least one GaN layer formed on said InP substrate.

2. The device as set forth in claim 1, further comprising a crystalline layer formed between said InP substrate and said GaN layer, said crystalline layer excluding phosphorus and having a lattice constant of about 0.98 to 1.02 times as large as that of said InP substrate.

3. The device as set forth in claim 2, wherein said crystalline layer is made of InGaAs.

* * * * *